(12) United States Patent  
Chen et al.

(10) Patent No.: US 12,463,055 B2  
(45) Date of Patent: Nov. 4, 2025

(54) PACKAGE SUBSTRATE MANUFACTURING METHOD

(71) Applicants: Zhuhai ACCESS Semiconductor Co., Ltd., Guangdong (CN); NEXPERIA B.V., Nijmegen (NL)

(72) Inventors: Xianming Chen, Guangdong (CN); Frank Burmeister, Guangdong (CN); Lei Feng, Guangdong (CN); Yujun Zhao, Guangdong (CN); Benxia Huang, Guangdong (CN); Jinxin Yi, Guangdong (CN); Jindong Feng, Guangdong (CN); Yuan Li, Guangdong (CN); Lina Jiang, Guangdong (CN); Edward Tena, Guangdong (CN); Wenshi Wang, Guangdong (CN)

(73) Assignees: Zhuhai ACCESS Semiconductor Co., Ltd., Guangdong (CN); NEXPERIA B.V., Nijmegen (NL)

( * ) Notice: Subject to any disclaimer, the term of this patent is extended or adjusted under 35 U.S.C. 154(b) by 422 days.

(21) Appl. No.: 18/005,608

(22) PCT Filed: Jul. 9, 2021

(86) PCT No.: PCT/CN2021/105394  
§ 371 (c)(1),  
(2) Date: Jan. 15, 2023

(87) PCT Pub. No.: WO2022/012422  
PCT Pub. Date: Jan. 20, 2022

(65) Prior Publication Data  
US 2023/0326765 A1 Oct. 12, 2023

(30) Foreign Application Priority Data  
Jul. 9, 2020 (CN) .......................... 202010679169.X

(51) Int. Cl.  
*H01L 21/00* (2006.01)  
*H01L 21/48* (2006.01)  
(Continued)

(52) U.S. Cl.  
CPC ...... *H01L 21/4857* (2013.01); *H01L 21/4828* (2013.01); *H01L 21/4871* (2013.01);  
(Continued)

(58) Field of Classification Search  
CPC ............ H01L 21/4828; H01L 21/4857; H01L 21/486; H01L 23/49894; H01L 23/49827  
See application file for complete search history.

(56) References Cited

U.S. PATENT DOCUMENTS

2006/0270211 A1* 11/2006 Nakamura .......... H01L 21/6835  
438/129  
2014/0346670 A1 11/2014 Su et al.  
2017/0005057 A1 1/2017 Hurwitz et al.

FOREIGN PATENT DOCUMENTS

CN 1873935 A 12/2006  
CN 102263076 A 11/2011  
(Continued)

OTHER PUBLICATIONS

International Search Report and Written Opinion in PCT/CN2021/105394 mailed Oct. 9, 2021.  
(Continued)

*Primary Examiner* — Reema Patel  
(74) *Attorney, Agent, or Firm* — Buchalter; Jason W. Croft

(57) ABSTRACT

A package substrate manufacturing method includes: providing a bearing plate, manufacturing a pattern and depositing metal to form the first circuit layer; manufacturing a pattern on the first circuit layer, depositing and etching metal to form a metal cavity, laminating a dielectric layer on the (Continued)

metal cavity, and performing thinning to expose the metal cavity; removing the bearing plate, etching the metal cavity to expose the cavity, depositing metal on the cavity and the dielectric layer, and performing pattern manufacturing and etching to form a second circuit layer; forming a first and second solder mask layers correspondingly on the first and second circuit layers, and performing pattern manufacturing on the first solder mask layer or the second solder mask layer to form a bonding pad; and cutting the cavity, the first circuit layer, the second circuit layer, the first solder mask layer and the second solder mask layer.

10 Claims, 6 Drawing Sheets

(51) Int. Cl.
    *H01L 21/768*      (2006.01)
    *H01L 23/498*      (2006.01)
    *H05K 3/18*      (2006.01)
    *H05K 3/34*      (2006.01)

(52) U.S. Cl.
    CPC .. *H01L 21/76871* (2013.01); *H01L 23/49894* (2013.01); *H05K 3/181* (2013.01); *H05K 3/3452* (2013.01)

(56) References Cited

FOREIGN PATENT DOCUMENTS

| | | |
|---|---|---|
| CN | 102593085 A | 7/2012 |
| CN | 102810549 A | 12/2012 |
| CN | 102881644 A | 1/2013 |
| CN | 106206484 A | 12/2016 |
| CN | 106997870 A | 8/2017 |
| CN | 111564374 A | 8/2020 |
| TW | 201343018 A | 10/2013 |
| TW | 201601224 A | 1/2016 |
| WO | 2017152714 A1 | 9/2017 |
| WO | 2022012422 A1 | 1/2022 |

OTHER PUBLICATIONS

Office Action in Chinese Application No. 202110715575.1 mailed Mar. 11, 2022.
First Search in Chinese Application No. 202110715575.1 mailed Mar. 7, 2022.
Supplementary Search in Chinese Application No. 202110715575.1 mailed May 11, 2022.

* cited by examiner

PACKAGE SUBSTRATE MANUFACTURING METHOD

CROSS-REFERENCE TO RELATED APPLICATIONS

This application is a national stage filing under 35 U.S.C. § 371 of international application number PCT/CN2021/105394, filed Jul. 9, 2021, which claims priority to Chinese patent application No. 202010679169.X filed Jul. 15, 2020. The contents of these applications are incorporated herein by reference in their entirety.

TECHNICAL FIELD

The disclosure relates to the technical field of semiconductor packaging, in particular to a manufacturing method for a package substrate.

BACKGROUND

With the continuous development of the microelectronics technology, the electronic industry is becoming increasingly complex and miniaturized, especially in mobile devices such as mobile phones and portable computers, more and more semiconductor devices are integrated. As the core of electronic device, chips are becoming more and more complex, requiring more and more input and output contacts to support more functional requirements.

Chip packages may be divided into leaded packages and leadless packages according to the types of leads. Compared with the leaded package, a leadless packaged semiconductor device has the advantages of low lead inductance, good heat conduction and thin package thickness, which can reduce the footprint on a printed circuit board (PCB).

The leadless packaged semiconductor devices commonly include a quad flat no-lead (QFN) device packaged on the basis of a lead frame, a land grid array (LGA) and a ball grid array (BGA) packaged on the basis of an organic packaging substrate. For the former, after the QFN device is mounted on the PCB, an automatic optical inspection system may be used to detect defects for its soldering condition. For the latter, since pins of the LGA and the BGA are designed to avoid the edges of the packages and cannot be exposed, there will be a detection blind area.

SUMMARY

The disclosure aims to solve one of the technical problems in the related art at least to a certain extent. To this end, the disclosure proposes a manufacturing method for a package substrate, and the following is an overview of the subject matter described in detail herein. This overview is not intended to limit the scope of protection of claims. Example technical solutions are as follows:

In a first aspect, embodiments of the disclosure provide a manufacturing method for a package substrate, including:
  providing a bearing plate, manufacturing a pattern of a first circuit layer on the bearing plate, and depositing metal to form the first circuit layer;
  manufacturing a pattern of a cavity on an upper surface of the first circuit layer, depositing and etching metal to form a metal cavity, laminating a dielectric layer on a surface of the metal cavity, and performing thinning to expose an upper surface of the metal cavity;
  removing the bearing plate, etching the metal cavity to expose the cavity, depositing metal on a surface and side walls of the cavity and a surface of the dielectric layer, and performing pattern manufacturing and etching to form a second circuit layer;
  forming a first solder mask layer and a second solder mask layer correspondingly on surfaces of the first circuit layer and the second circuit layer, and performing pattern manufacturing on the first solder mask layer or the second solder mask layer to form a bonding pad; and
  cutting the cavity, the first circuit layer, the second circuit layer, the first solder mask layer and the second solder mask layer.

According to the embodiments of the first aspect of the disclosure, the manufacturing method for a package substrate at least has the following beneficial effects. Firstly, the package substrate proposed in the disclosure may lead out solder joints of leads of electronic components to the side of the package substrate, which is convenient for optical detection and direct judgment on soldering condition. Secondly, as redistribution of multi-layer circuits may be implemented on the package substrate, the disclosure is suitable for wire bonding and die packaging of chips, as well as integrated packaging of multiple chips and multiple components, which improves the diversification and the integration of functions of the substrate. Thirdly, the package substrate proposed in the disclosure is simple in packaging process and saves the production cost.

Optionally, in an embodiment of the disclosure, depositing the metal includes sequentially depositing a metal seed layer and depositing a circuit layer.

Optionally, in an embodiment of the disclosure, the metal seed layer is made of a material including titanium or copper.

Optionally, in an embodiment of the disclosure, the manufacturing method further includes forming protective layers on the surfaces of the circuit layer and the bonding pad.

Optionally, in an embodiment of the disclosure, each of the protective layers is made of a material including nickel-palladium-gold, nickel-gold, tin, silver, or organic solderability preservative.

Optionally, in an embodiment of the disclosure, depositing the metal includes at least one of:
  performing metal deposition by physical sputtering; or
  performing metal deposition by electroless plating.

In a second aspect, embodiments of the disclosure provide another manufacturing method for a package substrate, including:
  providing a bearing plate, manufacturing a pattern of a first circuit layer on a bearing plate, and depositing metal to form the first circuit layer;
  laminating a dielectric layer on a surface of the first circuit layer, and drilling the dielectric layer to form a cavity;
  removing the bearing plate, depositing metal on a surface and side walls of the cavity and a surface of the dielectric layer, and performing pattern manufacturing and etching to form a second circuit layer;
  forming a first solder mask layer and a second solder mask layer correspondingly on surfaces of the first circuit layer and the second circuit layer, and performing pattern manufacturing on the first solder mask layer or the second solder mask layer to form a bonding pad; and
  cutting the cavity, the first circuit layer, the second circuit layer, the first solder mask layer and the second solder mask layer.

According to the embodiments of the second aspect of the disclosure, the manufacturing method for package substrate at least has the following beneficial effects. Firstly, the package substrate proposed in the disclosure can lead out solder joints of leads of electronic components to the side of the package substrate, which is convenient for optical detection and direct judgment on soldering condition. Secondly, as redistribution of multi-layer lines can be implemented on the package substrate, the disclosure is suitable for wire bonding and die packaging of chips, as well as integrated packaging of multiple chips and multiple components, which improves the diversification and the integration of functions of the substrate. Thirdly, the package substrate proposed in the disclosure is simple in packaging process and saves the production cost.

Optionally, in an embodiment of the disclosure, the dielectric layer is drilled by laser drilling.

Optionally, in an embodiment of the disclosure, the dielectric layer is made of a material including a prepreg, pellicular resin or polyethylene resin.

Optionally, in an embodiment of the disclosure, the dielectric layer has a thickness between 180 um and 250 um.

Other features and advantages of the disclosure will be set forth in the description which follows, and, in part, will become obvious from the description, or may be learned by practice of the disclosure. The objectives and other advantages of the disclosure will be realized and attained by the structure particularly pointed out in the description, the claims and the accompanying drawings.

BRIEF DESCRIPTION OF DRAWINGS

The accompanying drawings are used to provide further understanding of the technical solutions of the disclosure, constitute a part of the description, and are used together with the embodiments of the disclosure to explain the technical solutions of the disclosure, without constituting limitation to the technical solutions of the disclosure.

Figure 1:
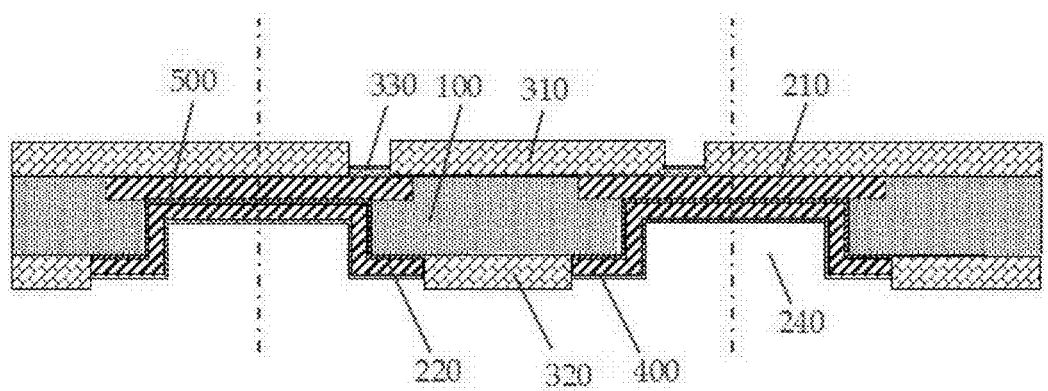
FIG. 1 is a cross-sectional view of a package substrate provided in an embodiment of the disclosure.

Dielectric layer 100, first circuit layer 210, second circuit layer 220, first solder mask layer 310, second solder mask layer 320, bonding pad 330, metal cavity 230, cavity 240, protective layer 400, seed layer 500, photosensitive dry film 600, and bearing plate 700.

DETAILED DESCRIPTION

In order to make the objectives, the technical solutions and the advantages of the disclosure clearer, the disclosure will be further described in detail below in conjunction with the accompanying drawings and the embodiments. It should be understood that the specific embodiments described here are only used to explain the disclosure, and are not used to limit the disclosure. Any modification of the structure, change of the proportional relationship or adjustment of the size, without affecting the efficacy that the disclosure can produce and the objectives that can be achieved, should still fall within the scope that the technical content disclosed in the disclosure can cover.

This part will describe specific embodiments of the disclosure in detail. The preferred embodiments of the disclosure are shown in the accompanying drawings. The accompanying drawings are used to describe the text part of the specification with figures, so that people can intuitively and vividly understand each technical feature of the disclosure and the overall technical solution, which should not be construed as limiting the scope of protection of the disclosure.

In the description of the disclosure, several refers to one or more, multiple refers to two or more, greater than, less than, over and the like are understood not to include this number, and above, below, within and the like are understood to include this number. If described, first and second are only for the purpose of distinguishing technical features, and not to be construed as indicating or implying relative importance or implicitly indicating the number of technical features indicated or implicitly indicating the precedence relationship of technical features indicated.

Referring to FIG. 1, a package substrate provided in an embodiment of the disclosure includes: a dielectric layer 100; a circuit layer, including a first circuit layer 210 and a second circuit layer 220 respectively arranged on an upper surface and a lower surface of the dielectric layer 100, where the first circuit layer 210 extends from the upper surface of the dielectric layer 100 horizontally beyond both ends of the dielectric layer 100, and the second circuit layer 220 extends from the lower surface of the dielectric layer 100, and extends along the side walls of the dielectric layer 100, to coincide with the first circuit layer 210, so as to form a flank structure; and a solder mask layer, including a first solder mask layer 310 and a second solder mask layer 320 respectively arranged on the surfaces of the first circuit layer 210 and the second circuit layer 220, where a bonding pad 330 is provided on one of the first solder mask layer 310 and the second solder mask layer 320, and the bonding pad 330 is connected to the circuit layer.

In an embodiment, the upper surface and the lower surface of the dielectric layer 100 are respectively covered with the first circuit layer 210 and the second circuit layer 220, and the solder mask layers and the bonding pad 330 are provided on the surfaces of the first circuit layer 210 and the second circuit layer 220, where the bonding pad 330 is connected with the first circuit layer 210 for connecting with a lead of an electronic component mounted on the package substrate. The first circuit layer 210 extends from the upper surface of the dielectric layer 100 horizontally beyond both ends of the dielectric layer 100, and the second circuit layer 220 extends from the lower surface of the dielectric layer 100, and extends along the side walls of the dielectric layer 100, to coincide with the first circuit layer 210, so as to form a flank structure. The first circuit layer 210 and the second circuit layer 220 wrap the dielectric layer 100, and the dielectric layer 100 and the flank structure constitute a chute cavity 240. When a semiconductor electronic component such as an LGA or a BGA with a lead position not exposed from the side is mounted, the lead located on the lower surface of the component is connected to the bonding pad 330, the bonding pad 330 is connected to the first circuit layer 210, and the first circuit layer 210 is led out by the flank structure, so that the electrical characteristic of the electronic component is drawn out to the flank structure on both sides of the dielectric layer 100. During PCB soldering, it is only necessary to wet the surface of the second circuit layer 220 in the cavity 240 with a solder material, where the solder material includes a tin-lead solder, a silver solder, a copper solder and the like.

Referring to FIG. 1, an embodiment of the disclosure provides a package substrate. The first circuit layer 210 include a first terminal of the first circuit layer and a second terminal of the first circuit layer which are separated by an insulating material, the second circuit layer 220 includes a first terminal of the second circuit layer and a second terminal of the second circuit layer which are separated by an insulating material.

In an embodiment, the first circuit layer 210 and the second circuit layer 220 respectively include two parts, where the two parts of the first circuit layer 210 are respectively arranged on the lower surfaces of two bonding pads, the two bonding pads are respectively connected to positive and negative leads of the electronic component, and positive and negative electrodes of the electronic component are drawn out to both sides of the substrate by means of the first terminal of the first circuit layer and the second terminal of the first circuit layer, to be connected to the first terminal of the second circuit layer and the second terminal of the second circuit layer respectively, thereby achieving electrical distinction. When multiple bonding pads are disposed on the substrate and correspondingly connected to multiple electronic components, the first circuit layer or the second circuit layer may be formed by two parts, which are correspondingly connected to the positive and negative electrodes of the same electronic component, the first circuit layer or the second circuit layer may also be of a non-disconnected structure (that is, a strip structure formed by a metal layer) which is connected to two bonding pads, and the two bonding pads correspond to the positive electrode (the negative electrode) of one electronic component and the negative electrode (the positive electrode) of another electronic component, so as to form electrical connection of multiple electronic components.

Referring to FIG. 1, the package substrate provided by an embodiment of the disclosure further includes protective layers 400, which are arranged on the surfaces of the circuit layer and the bonding pad 330. In an embodiment, the protective layers 400 cover the surfaces of the second circuit layer 220 and the bonding pad 330, which can prevent the exposed second circuit layer 220 or bonding pad 330 from being oxidized, and enhance the reliability of the substrate.

Referring to FIG. 1, in the package substrate provided by an embodiment of the disclosure, each of the protective layers 400 is made of a material including nickel-palladium-gold, nickel-gold, tin, silver, or organic solderability preservative.

Based on the above-mentioned package substrate, various embodiments of the manufacturing method for a package substrate of the disclosure are proposed.

Referring to FIGS. 2-11, another embodiment of the disclosure provides a manufacturing method for a package substrate, including, but is not limited to the following steps.

Figure 2:
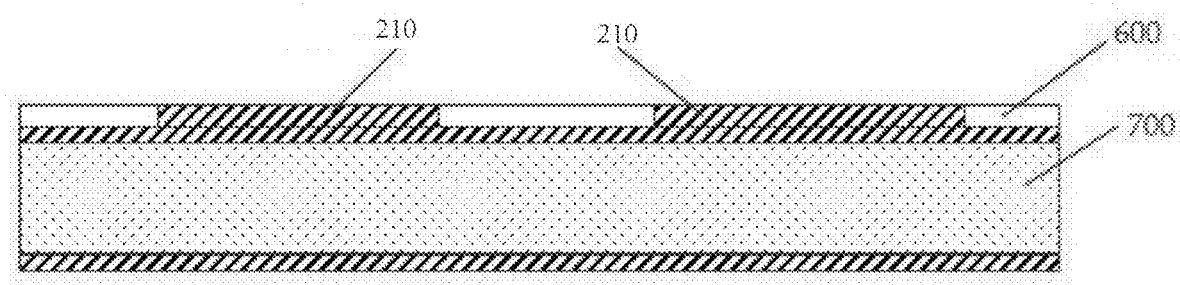
FIGS. 2-11 are cross-sectional views corresponding to the steps of a manufacturing method for a package substrate provided in another embodiment of the disclosure.

At Step S101, a bearing plate 700 is provided, a pattern of a first circuit layer 210 is manufactured on the bearing plate 700, and metal is deposited to form the first circuit layer 210. Specifically, as shown in FIG. 2, a photosensitive dry film 600 is applied on a surface of the bearing plate 700, the pattern of the first circuit layer 210 is formed by exposure and development, and then the first circuit layer 210 is formed by electroplating. Both sides of the bearing plate 700 may include detachable double-layer copper clad laminates, and the first circuit layer 210 may be formed on either sides of the bearing plate 700. In an embodiment of the disclosure, preferably, the manufacturing steps are described by taking one side as an example.

Figure 3:
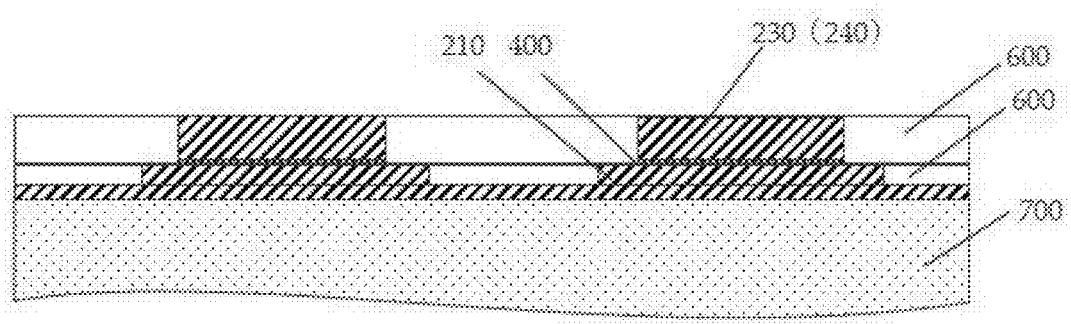
Figure 4:
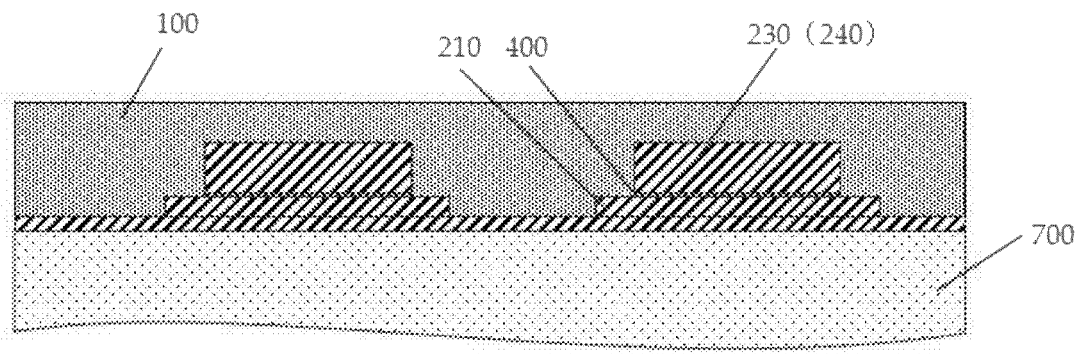
Figure 5:
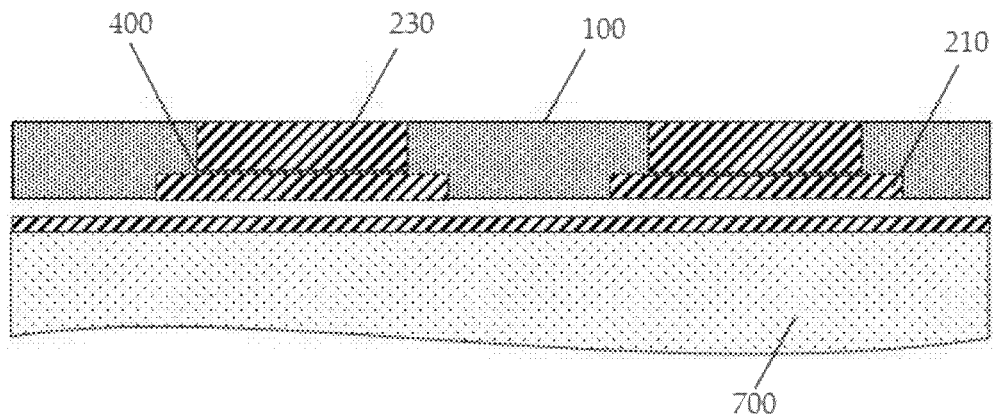

At Step S102, a pattern of a cavity 240 is manufactured on an upper surface of the first circuit layer 210, metal is deposited and etched to form a metal cavity 230, and a dielectric layer 100 is laminated on the surface of the metal cavity 230 and is thinned to expose the upper surface of the metal cavity 230. Specifically, as shown in FIG. 3, a layer of photosensitive dry film 600 is continued to be coated on the photosensitive dry film 600. The pattern of the cavity 240 is manufactured by exposure and development. Protective layers 400 are formed by electroplating or electroless plating. Then the metal cavity 230 is formed by electroplating. The first photosensitive dry film and the second photosensitive dry film are removed by using a film-removing solution, to expose the upper surface and side walls of the metal cavity 230. As shown in FIG. 4, the dielectric layer 100 is stacked and laminated. As shown in FIG. 5, the dielectric material is thinned and planarized by a plate grinding process until the upper surface of the strip-shaped metal cavity 230 is exposed, so that the upper surface of the metal cavity 230 and the upper surface of the dielectric layer 100 are in the same plane. The bearing plate 700 is separated from the dielectric layer 100, to make the first circuit layer 210 and the lower surface of the dielectric layer 100 in the same surface.

The material of the protective layer 400 may include a chemically inactive metal such as nickel or titanium; and the material of the dielectric layer 100 includes a prepreg (PP), pellicular resin (ABF) or epoxy resin (PID), where the prepreg and the pellicular resin may be thinned by plasma etching, plate grinding and polishing or laser drilling, etc., and the epoxy resin may be thinned by exposure and development, etc. In an embodiment of the disclosure, preferably, the prepreg is used as the dielectric layer 100 with a lamination thickness of 180-250 um. The prepreg is a thin sheet material made by impregnating treated glass fiber cloth with resin glue, and then conducting heat treatment (pre-baking) to make the resin enter a semi-cured stage, and the prepreg will be softened under heat and pressure, and will react and be cured after cooling.

Figure 6:
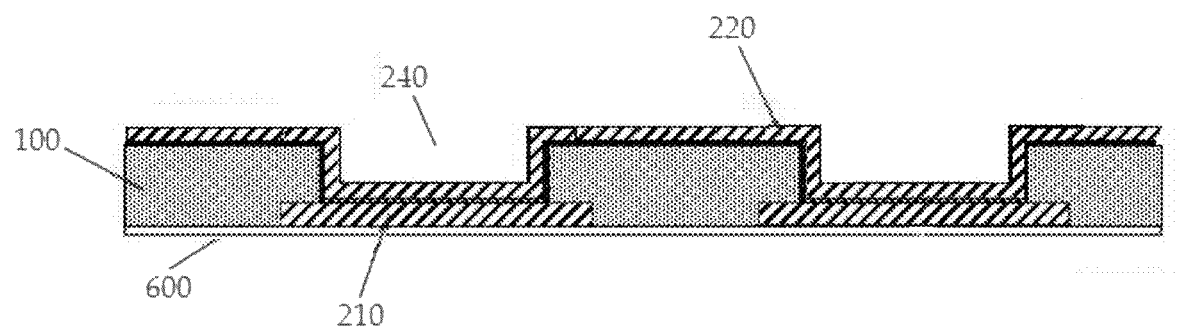
Figure 7:
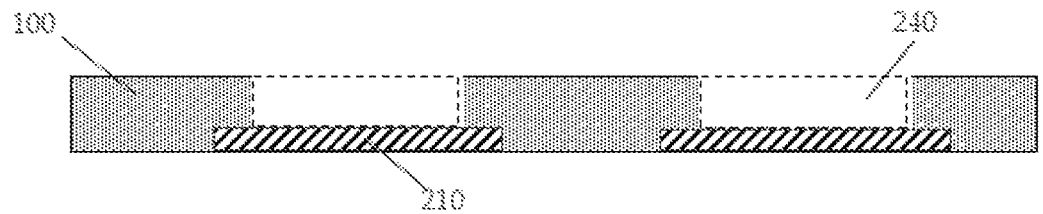
Figure 8:
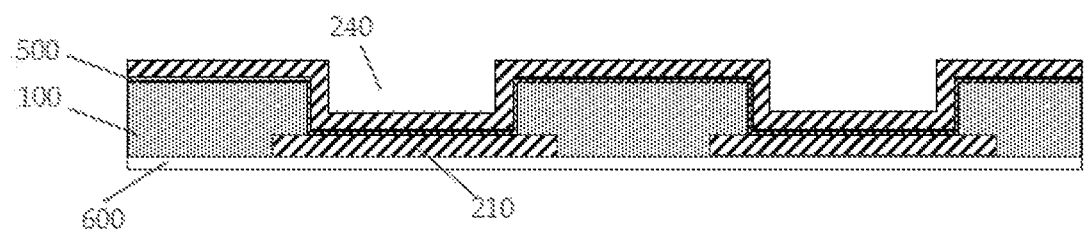
Figure 9:
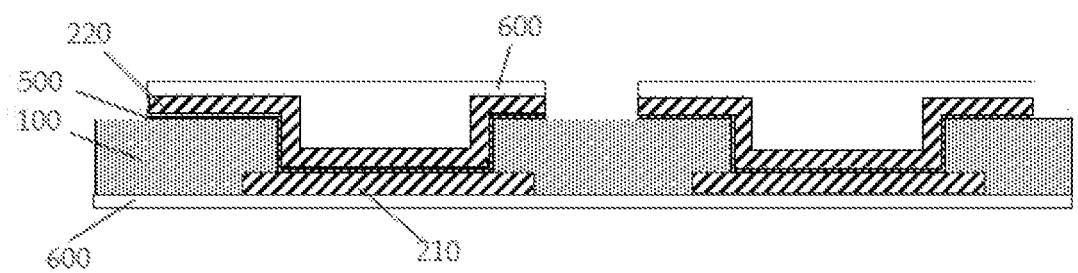

At Step S103, the bearing plate 700 is removed, the metal cavity 230 is etched to expose the cavity 240, metal is deposited on the surface and the side walls of the cavity 240 and the surface of the dielectric layer 100, and pattern manufacturing and etching are performed to form a second circuit layer 220. Specifically, as shown in FIG. 6, a photosensitive dry film 600 is coated on the lower surface of the dielectric layer 100 including the first metal layer, and is cured by a lithography process. The purpose of using flood exposure of the photosensitive dry film 600 is to protect the first circuit layer 210. The metal cavity 230 is etched with a metal etching solution to form a cavity 240. The side walls of the cavity 240 are vertical, and the size of the bottom is consistent with that of the top. The cavity 240 is composed of the bottom nickel metal protection layer 400 and the side wall organic resin medium layer 100. As shown in FIG. 7, the nickel metal protection layer 400 is removed by using a nickel etching solution, to expose the upper surface of the first circuit layer 210, and the photosensitive dry film 600 is removed with the film-removing solution to expose the lower surface of the first circuit layer 210. As shown in FIG. 8, a seed layer 500 is formed on the upper surface of the first circuit layer 210 and the upper surface of the dielectric layer 100 by sputtering or electroless plating, and the seed layer 500 includes metal such as titanium or copper (but is not limited to the these metals). The photosensitive dry film 600 is coated to the lower surface of the first circuit layer 210 for flood exposure to protect the first circuit layer 210, and then a metal copper layer is deposited on the upper surface of the seed layer 500 by full plate electroplating. As shown in FIG. 9, the photosensitive dry film 600 is coated to one side of the upper surface of the metal copper layer. The specific pattern is formed by photoetching. The metal copper layer and the seed layer 500 are etched by using an etching process to form the second circuit layer 220. The photosensitive dry films 600 on the upper and lower surfaces are removed with the film-removing solution.

The methods of depositing the metal may include physical sputtering and electroless plating. Preferably, an embodiment of the disclosure uses electroless plating to deposit the metal layer.

Figure 10:
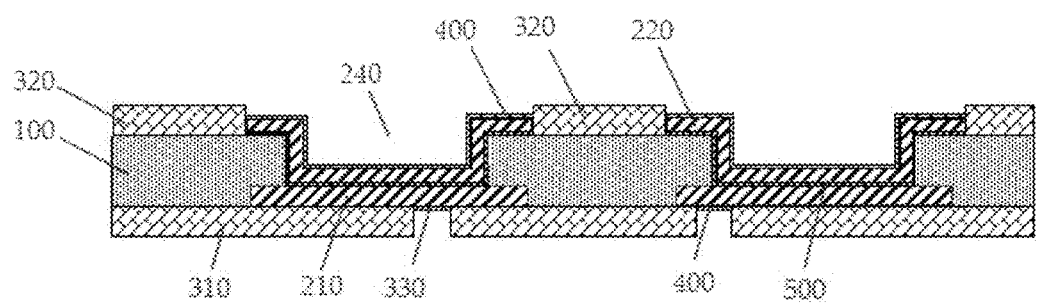

At step S104, a first solder mask layer 310 and a second solder mask layer 320 are formed correspondingly on the surfaces of the first circuit layer 210 and the second circuit layer 220, and pattern manufacturing is performed on the first solder mask layer 310 or the second solder mask layer 320 to form a bonding pad 330. Specifically, as shown in FIG. 10, the first solder mask layer 310 and the second solder mask layer 320 are respectively applied to the surfaces of the first circuit layer 210 and the second circuit layer 220, and the bonding pad 330 is formed at a specific position of the first solder mask layer 310 for being connected to the first circuit layer 210, and the surface of the bonding pad 330 and the surface of the second circuit layer 220 are further subjected to metal surface treatment to form protective layers 400. Surface treatment includes: depositing nickel-palladium-gold, nickel-gold, tin, silver or other chemically stable metal, and further includes: using organic solderability preservative for surface covering.

Figure 11:
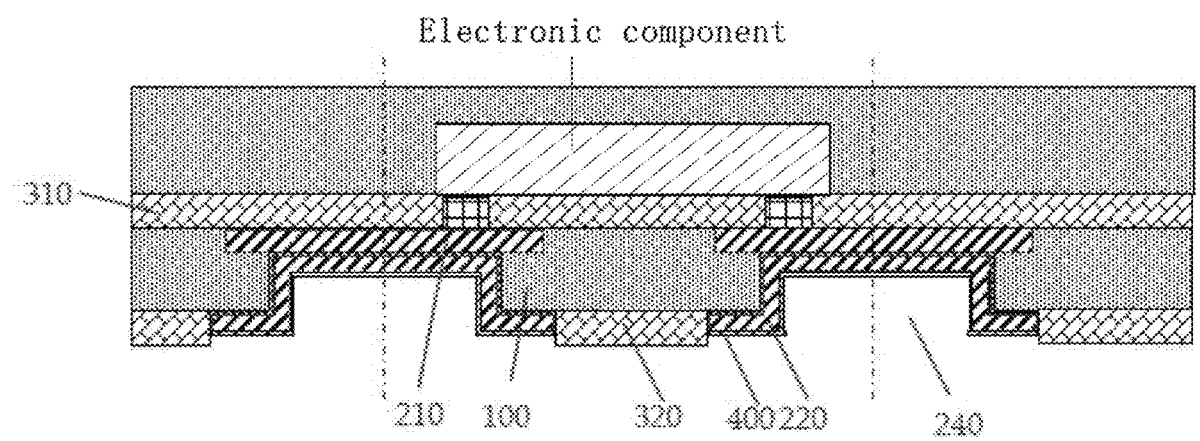

At step S105, the cavity 240, the first circuit layer 210, the second circuit layer 220, the first solder mask layer 310 and the second solder mask layer 320 are cut. Specifically, as shown in FIG. 11, the electronic component is mounted, leads of the electronic component is mounted on the bonding pad 330 and the electronic component is packaged with a plastic packaging material. Cutting is performed at the position of the cavity 240 to form a package unit, and the leads of the electronic component are drawn out to both cut ends of the first circuit layer 210 and the second circuit layer 220.

Referring to FIG. 2 and FIGS. 12-16, another embodiment of the disclosure further provides another manufacturing method for a package substrate, including, but is not limited to the following steps.

At Step S201, a bearing plate 700 is provided, a pattern of a first circuit layer 210 is manufactured on the bearing plate 700, and metal is deposited to form the first circuit layer 210. Specifically, as shown in FIG. 2, a photosensitive dry film 600 is applied on the bearing plate 700, the pattern of the first circuit layer 210 is formed by exposure and development, and then the first circuit layer 210 is formed by electroplating.

Figure 12:
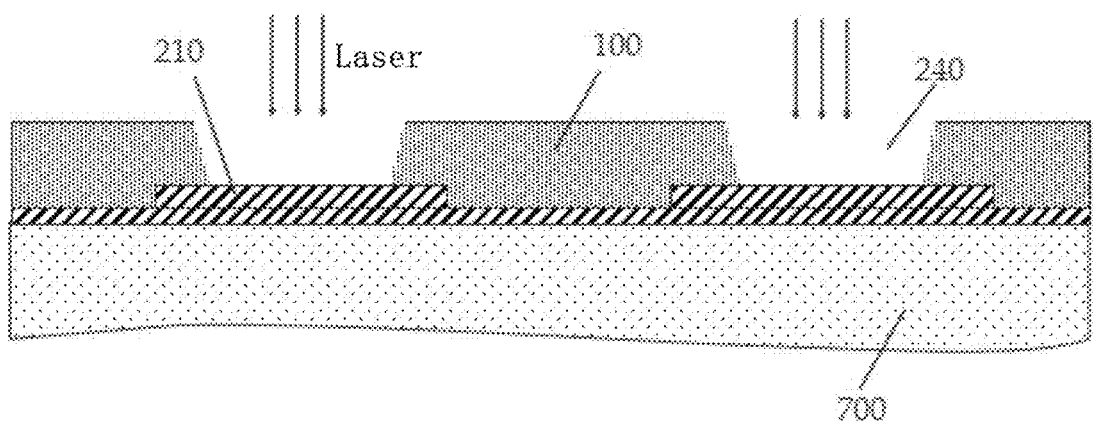
FIGS. 12-16 are cross-sectional views corresponding to the steps of a manufacturing method for a package substrate provided in another embodiment of the disclosure.

At Step S202, a dielectric layer 100 is laminated on the surface of the first circuit layer 210, and drilling is performed on the dielectric layer 100 to form a cavity 240. Specifically, as shown in FIG. 12, the dielectric layer 100 is stacked and laminated, and is adjusted according to the design needs. Preferably, in an embodiment of the disclosure, a thickness of the dielectric layer 100 is between 180 um and 250 um, and a material of the dielectric layer 100 includes thermosetting organic resin (such as a prepreg or pellicular resin) or thermoplastic organic resin (such as polyethylene). Preferably, in an embodiment of the disclosure, the dielectric layer 100 uses the prepreg, which is a thin sheet material made by impregnating treated glass fiber cloth with resin glue, and then conducting heat treatment (pre-baking) to make the resin enter a semi-cured stage; and the prepreg will be softened under heat and pressure, and will react and be cured after cooling. The cavity 240 is formed in the dielectric layer 100 by laser drilling, and the bottom of the cavity 240 is flush with the upper surface of the first circuit layer 210. The size of a bottom opening of the cavity 240 may be smaller than that of a top opening to form a structure of a trapezoidal cavity 240, which can also realize lead-out of the leads of the electronic component.

Figure 13:
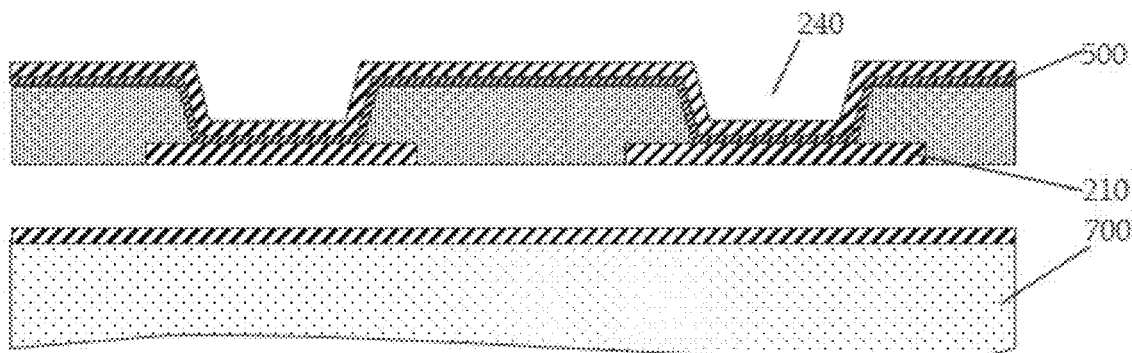
Figure 14:
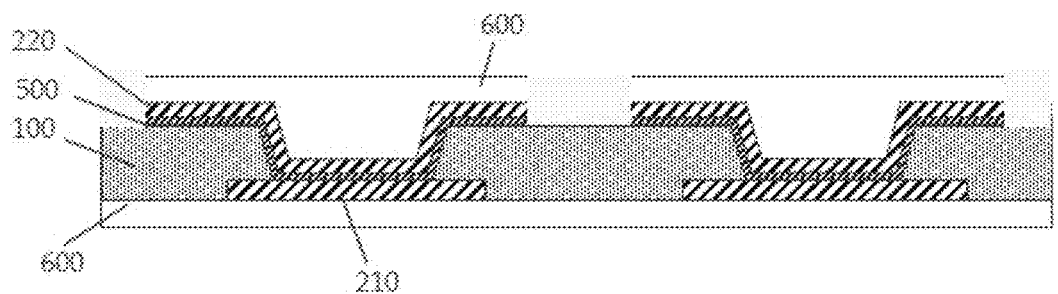

At Step S203, the bearing plate 700 is removed, metal is deposited on the surface and the side walls of the cavity 240 and the surface of the dielectric layer 100, and pattern manufacturing and etching are performed to form a second circuit layer 220. Specifically, as shown in FIG. 13, the bearing plate 700 is removed, so that the lower surface of the first circuit layer 210 and the lower surface of the dielectric layer 100 are in the same plane. A seed layer 500 is formed in the cavity 240 and on the upper surface of the dielectric layer 100 by sputtering or electroless plating. The metal layer is deposited on the upper surface of the seed layer 500 by full plate electroplating, and the deposition thickness may be provided according to actual design. In an embodiment of the disclosure, preferably, the deposition thickness is between 15 um and 30 um. As shown in FIG. 14, the photosensitive dry film 600 is coated to both the upper surface of the metal layer and the lower surface of the dielectric layer 100. The pattern is manufactured on the photosensitive dry film 600 on the upper surface, and the redundant metal layer and seed layer 500 are removed by etching to form the second circuit layer 220. The photosensitive dry films 600 on the upper surface and the lower surface are removed by means of film removal.

Figure 15:
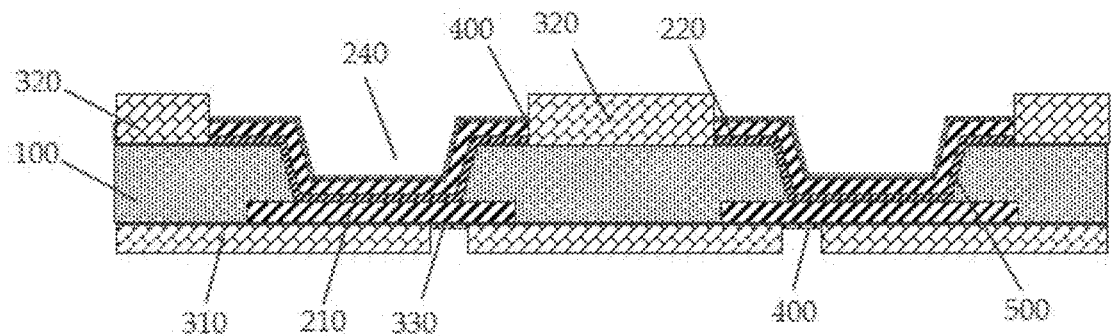

At Step S204, a first solder mask layer 310 and a second solder mask layer 320 are correspondingly formed on the surfaces of the first circuit layer 210 and the second circuit layer 220, and pattern manufacturing is performed on the first solder mask layer 310 or the second solder mask layer 320 to form a bonding pad 330. Specifically, as shown in FIG. 15, solder mask layers are applied to the upper surface and lower surface of the substrate, a specific bonding pad 330 is formed by a lithography process, and protective layers 400 are applied to the surface of the second circuit layer 220 and the surface of the bonding pad 330 by means of a surface treatment process.

Figure 16:
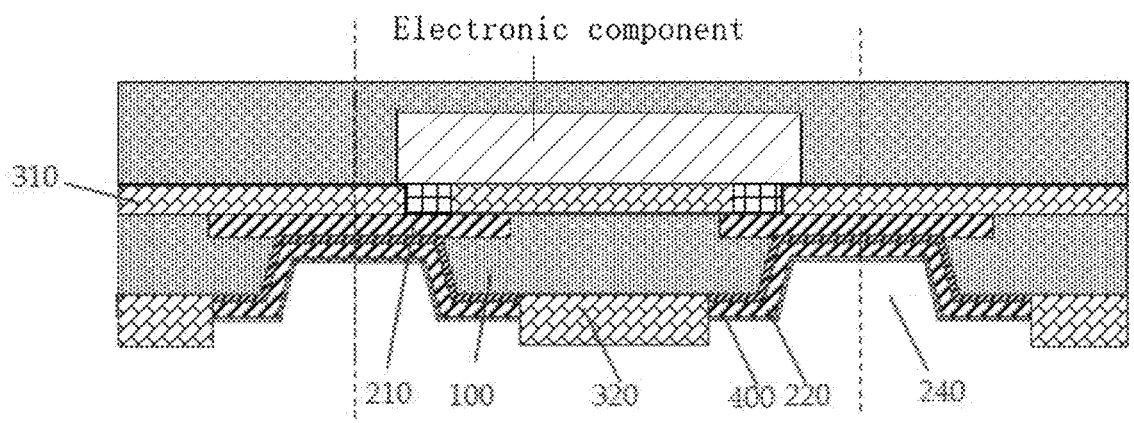

At Step S205, the cavity 240, the first circuit layer 210, the second circuit layer 220, the first solder mask layer 310 and the second solder mask layer 320 are cut. Specifically, as shown in FIG. 16, an electronic component is mounted, leads of the electronic component are mounted at the position of the bonding pad 330 and the electronic component is packaged with a plastic packaging material. Cutting is performed at the position of the cavity 240 to form a package unit, and the leads of the electronic component are drawn out to both ends of the first circuit layer 210 and the second circuit layer 220.

The above is a specific description of the preferred embodiments of the disclosure, but the disclosure is not limited to the above-mentioned embodiments, and those having ordinary skills in the art can also make various equivalent deformations or replacements without violating the gist of the application. These equivalent modifications or replacements are all included within the scope defined by the claims of the disclosure.

What is claimed is:
1. A manufacturing method for a package substrate, comprising:
  providing a bearing plate, manufacturing a pattern of a first circuit layer on the bearing plate, and depositing metal to form the first circuit layer;

manufacturing a pattern of a cavity on an upper surface of the first circuit layer, depositing and etching metal to form a metal cavity, laminating a dielectric layer on a surface of the metal cavity, and performing thinning to expose an upper surface of the metal cavity;

forming a second circuit layer by removing the bearing plate, etching the metal cavity to expose the cavity, depositing metal on a surface and side walls of the cavity and a surface of the dielectric layer, and performing pattern manufacturing and etching;

forming a first solder mask layer and a second solder mask layer correspondingly on surfaces of the first circuit layer and the second circuit layer, and performing pattern manufacturing on the first solder mask layer or the second solder mask layer to form a bonding pad; and cutting the cavity, the first circuit layer, the second circuit layer, the first solder mask layer and the second solder mask layer.

2. The manufacturing method for a package substrate of claim 1, wherein in the process of forming the second circuit layer, depositing the metal comprises sequentially depositing a metal seed layer and depositing a circuit layer.

3. The manufacturing method for a package substrate of claim 2, wherein the metal seed layer is made of a material comprising titanium or copper.

4. The manufacturing method for a package substrate of claim 1, further comprising arranging protective layers on the surfaces of the circuit layers and the bonding pad, respectively.

5. The manufacturing method for a package substrate of claim 4,
wherein each of the protective layers is made of a material comprising nickel-palladium-gold, nickel-gold, tin, silver, or organic solderability preservative.

6. The manufacturing method for a package substrate of claim 2, wherein depositing the metal comprises at least one of:
performing metal deposition by physical sputtering; or
performing metal deposition by electroless plating.

7. A manufacturing method for a package substrate, comprising:
providing a bearing plate, manufacturing a pattern of a first circuit layer on the bearing plate, and depositing metal to form the first circuit layer;
laminating a dielectric layer on a surface of the first circuit layer, and drilling the dielectric layer to form a cavity;
removing the bearing plate, depositing metal on a surface and side walls of the cavity and a surface of the dielectric layer, and performing pattern manufacturing and etching to form a second circuit layer;
forming a first solder mask layer and a second solder mask layer correspondingly on surfaces of the first circuit layer and the second circuit layer, and performing pattern manufacturing on the first solder mask layer or the second solder mask layer to form a bonding pad; and
cutting the cavity, the first circuit layer, the second circuit layer, the first solder mask layer and the second solder mask layer.

8. The manufacturing method for a package substrate of claim 7, wherein the dielectric layer is drilled by laser drilling.

9. The manufacturing method for a package substrate of claim 7, wherein the dielectric layer is made of a material comprising a prepreg, pellicular resin or polyethylene resin.

10. The manufacturing method for a package substrate of claim 9, wherein the dielectric layer has a thickness between 180 μm and 250 μm.

\* \* \* \* \*